United States Patent [19]

Baker et al.

[11] Patent Number: 4,935,086

[45] Date of Patent: Jun. 19, 1990

[54] PROCESS OF BONDING AN ELECTRICAL DEVICE PACKAGE TO A MOUNTING SURFACE

[75] Inventors: Thomas E. Baker, Northborough; Nicki S. Girouard, Newton, both of Mass.

[73] Assignee: Raytheon Company, Lexington, Mass.

[21] Appl. No.: 917,294

[22] Filed: Oct. 8, 1986

Related U.S. Application Data

[62] Division of Ser. No. 820,481, Jan. 13, 1986, abandoned.

[51] Int. Cl.$^5$ ............................................... B32B 31/00
[52] U.S. Cl. ...................................... 156/246; 29/832; 156/152; 156/307.3; 156/313; 156/331.7; 524/430; 524/590; 524/786
[58] Field of Search ......................... 524/430, 786, 590; 29/832; 156/152, 313, 307.3, 331.7, 246

[56] References Cited

U.S. PATENT DOCUMENTS

| | | |
|---|---|---|
| 3,538,038 | 7/1980 | Blanc et al. |
| 3,813,361 | 5/1974 | Gillis et al. ........................ 524/590 |
| 3,891,594 | 6/1975 | Taylor ................................ 524/786 |
| 4,016,130 | 12/1981 | Antczak . |
| 4,259,412 | 3/1981 | Buzio et al. ....................... 156/331.7 |
| 4,353,958 | 8/1980 | Kita et al. . |
| 4,489,487 | 12/1984 | Bura ..................................... 29/832 |
| 4,543,366 | 1/1985 | Smith . |
| 4,555,533 | 11/1985 | Ambros et al. .................... 524/430 |

FOREIGN PATENT DOCUMENTS

| | | |
|---|---|---|
| 55009634 | 3/1971 | Japan . |
| 57212222 | 2/1979 | Japan . |
| 57212223 | 9/1982 | Japan . |
| 905230 | 7/1987 | U.S.S.R. . |

OTHER PUBLICATIONS

Information Sheet No. EP-79-13-E on Furane® Products (specifically Uralane 5733 resin) by M & T Chemicals, Inc. Functional Plastics Division.

Bulletin No. P-143 on Conathane® polyurethane (including EN-12 polyurethane) by Conap, Inc.

Data Sheet entitled, "Hydrated, Calcined, Tabular Aluminas and Calcium Aluminate Cement", by Aluminum Company of America, Jun. 1, 1971.

Data Sheet entitled, "Cao-O-Sil Properties and Functions", by Cabot Corporation.

Product Information Sheet on Scotchcast® Brand Electrical Resin 226, by 3M Company, Industrial Electrical Products Division.

"Ablefilm 501-Low Temperature Cure, Electronics Grade Adhesive Film"; Ablestik Laboratories, Rev. 8/82.

*Primary Examiner*—John J. Gallagher
*Attorney, Agent, or Firm*—Christopher L. Maginniss; Richard M. Sharkansky

[57] ABSTRACT

A thermally conductive adhesive, and processes for formulating the same, are provided for bonding an electrical device package, such as an integrated circuit (IC) package, to a surface of a substrate, such as a printed circuit board. The thermally conductive adhesive comprises a polyurethane-based resin material and a predetermined amount of thermally conducting, electrically insulating material, such as alumina, mixed therewith. With such arrangement, a thermally conductive adhesive is provided having a low modulus of elasticity. Thus, such adhesive is soft and pliable rather than rigid, and thus deforms in response to the different amounts of thermal expansion, or contraction, of the IC package and PCB against, or away from, the thermally-conductive adhesive, thereby preventing damage to either the IC package or PCB, or separation of solder joints therebetween, due to such thermal expansion or contraction. Additionally, such adhesive has a low bond strength, thus allowing an IC package to be removed from a PCB without damaging either the IC package or PCB. Also, such adhesive is found to have low outgassing properties. The thermally conductive adhesive may be formed into a film, mixed with a solvent and sprayed into a film, or applied directly to the PCB as paste-like substance.

12 Claims, 3 Drawing Sheets

PROCESS OF BONDING AN ELECTRICAL DEVICE PACKAGE TO A MOUNTING SURFACE

The Government has rights in this invention pursuant to Contract No. N00030-84-C-0036 awarded by the Department of the Navy.

This application is a divisional of application Ser. No. 820,481, filed Jan. 13, 1986, now abandoned.

BACKGROUND OF THE INVENTION

This invention relates generally to thermally conductive adhesive material and manufacturing methods and more particularly to thermally conductive adhesive material and manufacturing methods for bonding integrated circuit (IC) packages to the surface of a printed circuit board (PCB). (As is known in the art, an integrated circuit package is typically mounted on a printed circuit board with an adhesive material disposed between the IC package and the surface of the PCB. The adhesive material serves the dual purpose of bonding the IC to the printed circuit board and dissipating heat generated by the IC into the printed circuit board. The thermally conductive adhesive material is usually electrically insulating to prevent, for example, a short circuit from occurring between IC leads which contact the adhesive material. One type of thermally conductive adhesive material which has been used is an epoxy-based resin material,) such as Ablefilm 506 TM epoxy, manufactured by Ablestik Laboratories of Gardena, California. While such epoxy-based adhesive performs satisfactorily in some applications, often the adherence properties (i.e. the bond strength between the epoxy and the IC package or PCB) thereof are too strong to allow removal of the IC package without damaging the device. For example, typical thermally conductive epoxies have bond strengths of about 2,000 psi. Further, such epoxy-based adhesive materials when cured have a relatively high modulus of elasticity (i.e. Young's Modulus) under both compression and tension stress, well above 500,000 psi at room temperature. As is known, the modulus of elasticity of a material is the ratio of stress applied (either in compression or tension) to the material to the strain induced thereby (in compression or tension, respectively). Materials having a high modulus of elasticity, such as epoxy, are quite rigid and thus do not deform in response to thermal expansion or contraction of the IC or PCB. Since there is typically a mismatch between the thermal expansion and contraction characteristics of an IC package and a printed circuit board, the rigidity of the epoxy-based adhesive material disposed therebetween may cause damage to the IC package, separation of solder joints between the IC and PCB, or cracking of circuit "runs" on the PCB in response either to the thermal expansion of the IC package and PCB against the rigid epoxy-based adhesive material in the presence of elevated temperatures or to the slight contraction of the IC package and PCB away from each other as occurs when such structures are cooled.

Another type of thermally conductive adhesive material is a "hot melt" adhesive, such as Adhesive No. 1670, manufactured by Rexham Corporation of Matthews, North Carolina. Such a "hot melt" adhesive is a waxlike material which is applied at elevated temperatures when the adhesive is formable, the waxlike adhesive hardening when cooled. However, such "hot melt" adhesives typically deteriorate when exposed to solvents of the type normally applied to the surface of a PCB to prepare the board for conformal coating. Silicone-based adhesive materials, which have a relatively low modulus of elasticity and thus are soft and pliable, are also available, but such silicone material swells during the solvent cleaning process described above. Also, silicone may be extracted from the adhesive material by the solvent and redeposited on the surface of the PCB, thereby causing poor adhesion of the subsequently-applied conformal coating to the PCB.

In addition, it may be desirable that the thermally conductive adhesive material have low outgassing properties, that is, a decreased tendency to evaporate small portions of the material in the form of gas molecules.

SUMMARY OF THE INVENTION

In accordance with the present invention, a thermally conductive adhesive for bonding an electrical device package, such as an integrated circuit (IC) package, to a surface of a substrate, such as a printed circuit board (PCB), is provided, such thermally conductive adhesive comprising: a polyurethane-based resin material; and, a predetermined amount of thermally conducting, electrically insulating material mixed with the resin material. With such arrangement, a thermally conductive adhesive is provided having a low modulus of elasticity. Thus, such adhesive is soft and pliable rather than rigid, and thus deforms in response to the different amounts of thermal expansion or contraction of the IC package and PCB against, or away from, the thermally-conductive adhesive, thereby preventing damage to either the IC package or PCB, or separation of solder joints therebetween, due to such thermal expansion, or contraction. Additionally, the bond strength of the adhesive is much lower than that of epoxy, thus allowing an IC package to be removed from a PCB without damaging either the IC package or PCB. Further, such adhesive is resistant to solvents used to clean the PCB prior to conformal coating thereof, and does not release contaminants which may degrade the adhesion of such conformal coating to the PCB. Also, such adhesive is found to have low outgassing properties.

In a preferred embodiment of the present invention, the adhesive is in the form of a film having predetermined thickness which may be disposed between the integrated circuit package and the printed circuit board Also, the polyurethane-based resin material of such adhesive film is selected to have a relatively low glass transition temperature, such as below −50°C., thereby providing an adhesive film having a low modulus even at temperatures as low as −50°C.

Further according to the present invention, a process is provided for forming a thermally conductive adhesive film for bonding an integrated circuit package to a mounting surface. Such process comprises the steps of: providing a polyurethane-based resin material; mixing a predetermined amount of thermally conductive, electrically insulating material with such polyurethane-based resin material; and, curing such mixture while forming a film having a predetermined thickness from such mixture.

BRIEF DESCRIPTION OF THE DRAWINGS

The foregoing features of the present invention and the advantages thereof may be fully understood from the following detailed description read in conjunction with the accompanying drawings wherein.

DESCRIPTION OF THE PREFERRED EMBODIMENT

Figure 1:
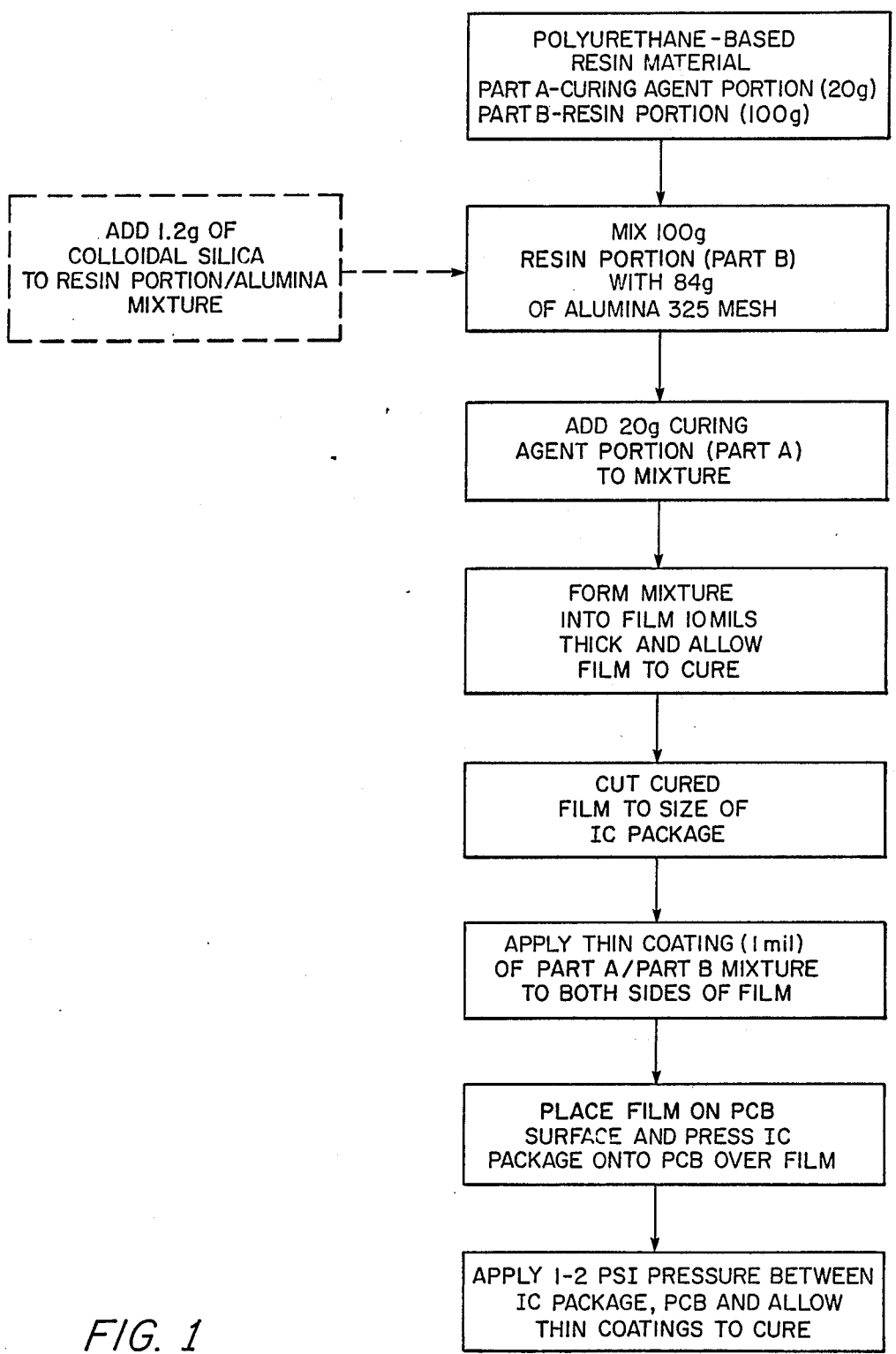
FIG. 1 is a flow diagram of a preferred embodiment of the process of the present invention of formulating the thermally conductive adhesive of the present invention and bonding an integrated circuit (IC) package to a printed circuit board (PCB) with such thermally conductive adhesive.

Referring now to FIG. 1, the process of formulating the thermally conductive adhesive of the present invention is illustrated. As is discussed hereinafter, in the preferred embodiment the thermally conductive adhesive of the present invention is fabricated in the form of a film of predetermined thickness. Such film may be used for bonding an electrical device package, such as an integrated circuit (IC) package, to a mounting surface or substrate, such as a printed circuit board and for providing a thermally conductive path to dissipate heat generated by the IC package into the PCB. The initial step in such process involves providing a predetermined amount of a polyurethane-based resin material. Here, such polyurethane-based resin is selected to be Uralane 5753 TM resin, manufactured by Furane Products Company of Los Angeles, California. Alternately, EN-12 TM polyurethane, manufactured by Conap Inc., of Allegany, New York may be used. A polyurethane-based resin material is used instead of the epoxy-based resin materials of the prior art because polyurethane-based resins have a much lower modulus of elasticity (i.e. Young's Modulus) than epoxy-based resins. As is known, the modulus of elasticity (hereinafter referred to as "modulus") of a material is the ratio between the stress applied to the material either in compression or tension (i.e. the measure of force in psi per unit area) and the strain experienced by the material (i.e. the deformation of the material in response to the applied stress) in compression or tension, respectively. The rigidity of a material is a function of the modulus thereof: relatively high-modulus materials, such as epoxy-based resins, are quite rigid and non-deformable, whereas relatively low-modulus materials such as polyurethane-based resins are relatively soft, pliable and deformable. The polyurethane-based resin used here, Uralane 5753 TM resin, has a modulus of elasticity under compression stress of about 1,760 psi (pounds per square inch) at room temperature and a modulus of elasticity under tension stress of about 3,260 psi at room temperature, while a typical epoxy-based resin has moduli of elasticity under both compression and tension stress of well over 500,000 psi at room temperature. Thus, the adhesive film of the present invention, comprising such low-modulus polyurethane-based resin material, when interposed between an electrical device package (such as an IC package) and a mounting surface (such as a PCB) in a manner discussed in detail hereinafter, will readily deform and expand in response to the thermal expansion or contraction of such IC package and PCB, even if the IC package and PCB expand or contract at different rates and amounts. Thus, any thermal expansion by the IC package or PCB (such as occurs when the IC and PCB are heated) will be absorbed by the adhesive film and such thermally adhesive film will also stretch in response to thermally-induced contraction of the IC package and PCB (such as occurs when the IC and PCB are cooled), thereby preventing damage to the integrated circuit package, separation of solder joints between the IC package and the circuit board, or cracking of the PCB itself (or circuit "runs" on the PCB), as a result of such expansion, or contraction, by the IC package or PCB against, or away from, the thermally conductive adhesive disposed therebetween.

(As is known, polyurethane-based resins, such as Uralane 5753 TM resin, are commercially available as separate, two-part substances: a resin portion and a curing-agent portion.) The resin portion may be mixed with other materials, as will be discussed, and exists in an unhardened, paste-like state until the curing agent portion is added thereto, as is discussed hereinafter. The resin portion of Uralane 5753 TM is Uralane 5753B TM, and the curing agent portion is Uralane 5753A TM. Here, 100 grams (g) of Uralane 5753B TM resin portion are used for every 20g of Uralane 5753A TM curing agent portion. The process of the present invention will be described for use with 100g of the resin portion, with the understanding that different amounts may be substituted therefor.

A polyurethane-based resin by itself has relatively poor thermal conductivity. For example, the thermal conductivity of Uralane 5753 TM resin is less than 0.1 BTU/ft.- hr.-°F., too low to efficiently dissipate heat from an operating IC package to the PCB. Thus, the second step of the process of the present invention of formulating the polyurethane-based thermally conductive adhesive of the present invention is to mix 100g of the resin portion of such polyurethane-based resin with a predetermined amount of a (thermally conductive, electrically insulating ceramic material, such as alumina.) Here, alumina powder is used in order to provide complete and even mixing of the alumina throughout the resin portion. Here, tabular alumina 325 mesh manufactured by Alcoa Corporation of Pittsburgh, Pennsylvania is used. (Other materials having like properties, such as boron-nitride, may be used in place of alumina.) However, it is noted that the adhesive film, when interposed between an IC package and a PCB, will often contact several leads of the IC package and also printed circuit "runs" of the PCB. Thus, in order to avoid short circuiting such leads and circuit runs, the adhesive must not be electrically conductive to a high degree. Metal therefore should not be used in place of alumina to provide the adhesive with the required thermal conductivity. It has been found that mixing approximately 84% alumina powder by weight of the resin portion (i.e., here 84g of alumina) provides the adhesive with a thermal conductivity of approximately 0.72 BTU/ft-hr-°F. Tests have shown that a mixture of 84g of alumina powder with 100g of resin portion yields a material having an electrical resistivity of about $8.7 \times 10^{14}$ ohms/cm. Different amounts of alumina may be used depending on the thermal conductivity desired. For example, a mixture of approximately 72% alumina powder by weight of the resin portion (i.e., 72g of alumina)

decreases the thermal conductivity of the adhesive to about 0.42 BTU/hr.-ft.-°F. Mixing the alumina powder with the resin portion of the polyurethane-based resin may be done by any conventional method, such as by stirring the alumina powder into the resin with a mixer. Here, the mixer is operated at approximately 150–1000 rpm for about 10 minutes.

After filling the resin portion with alumina, the mixture theoretically may be stored for long periods of time before such is to be mixed with the curing agent portion in a manner to be described. However, it has been found that if the mixture of the resin portion and alumina is stored for more than 24 hours, the alumina settles in lower portions of the resin and is not easily re-mixed. (To extend this "shelf life", a colloidal silica, such as Cab-O-Sil ™ silica, manufactured by Cabot Corporation of Billerica, Massachusetts, is blended into the resin-alumina mixture.) Here, approximately 1.2g of such colloidal silica is added. (The addition of the colloidal silica to the resin portion-alumina alumina mixture inhibits settling of the alumina for about 6 months, thereby extending the shelf life of the mixture without impeding any of the low adhesive, low modulus or low outgassing properties thereof.) Thus, the mixture may be prepared well in advance of the intended use thereof in the manner to be discussed. The resin portion-/alumina mix will not harden until the addition of the curing agent portion thereto.

As discussed, the resin portion/alumina mixture is cured by adding a predetermined amount of a curing agent, here Uralane 5753A ™ curing agent, thereto. Here, 20g of curing agent is added for every 100g of resin portion used (i.e. 20% by weight of the resin portion). Thus, neglecting the small amount of colloidal silica in the material, the mixture of the preferred embodiment has a total weight of approximately 204g (100g resin portion, 84g alumina, 20g curing agent portion). Thus it is seen that, here, the measure of alumina is approximately 70% by weight of the combined resin and curing agent portions. It is also seen that the measure of colloidal silica (1.2g) is approximately 1% by weight of such combined portions. After the curing agent is added, the mixture will be workable for 20 to 30 minutes before hardening to a point where the material may not easily be formed or molded into a desired shape. Within such time in the process of FIG. 1, the mixture is drawn in a conventional manner into a thin sheet or film having uniform thickness, here approximately 10 mils (the space between the lower surface of an IC package and the surface of a PCB on which such IC package is mounted). To prevent the mixture from adhering to the structure used to form it into a film, a surface comprising non-stick material, such as Teflon ® material, is used here to form the film. Other materials may be used to form the film, but such materials should, like Teflon ® material, deposit no contaminates (such as silicones) into the film while it cures. Here, the total cure time is approximately 16 hours at room temperature followed by 10 hours at 80° C. It is noted that other procedures for curing the mixture which would take less time may be employed, such as by subjecting the film to elevated temperatures (e.g., 80° C) from the start of the curing process. However, it has been found that beginning the curing process at substantially room temperature allows the film to gel, whereas the mixture tends to run if heated right away.

After the thermally conducting, adhesive film cures, it retains its shape but is soft and pliable (due to the low modulus thereof) and may be cut to the dimensions of an IC package to be mounted on a PCB. The cured film is itself non-adhering and thus will not stick to the IC package or PCB. Thus, to bond the IC package to the PCB with such thermally conducting film, both sides of the film are "wetted", that is, a thin coating of a resin portion/ curing agent portion mix is applied to each side of the film. Specifically, a small amount of the resin portion (part B) of Uralane 5753 ™ resin is mixed with 20% by weight of the curing agent portion (part A) thereof and, before curing, a thin coating (for example, approximately 1 mil) of such mix is applied to the sides of the thermally conductive film. The film is then placed on the surface of a PCB and an IC package is pressed onto the PCB over the film, with one of the "wetted" sides of the film in contact with the PCB upper surface and the other "wetted" side contacting the lower surface of the IC package. A small amount of pressure for example 1 to 2 psi, is applied between the package and the PCB, such as by placing a small weight on the IC package, while the thin coatings are allowed to cure. As discussed, curing may take place at room temperature or at elevated temperatures. Here, cure time is 16 hours at room temperature followed by 10 hours at 80° C. The cured coatings will loosely bond the thermally conductive film to the IC package and the PCB, respectively. Thus the low modulus thermally conductive adhesive film of the present invention will provide a low-strength bond between the IC package and PCB while providing an efficient thermally conducting path between the IC package and PCB to draw heat away from the IC package during the operation thereof. It is noted that the thin mixture coatings applied to both sides of the film to make the film adhere to the IC package and PCB do not appreciably degrade the thermal conductivity provided by the film That is, even if the coatings of resin portion/curing agent portion mix have no alumina mixed within them, such coatings are so thin (approximately 1 mil) that the overall thermal conductivity between the IC package and PCB is not significantly decreased. Alternately, alumina powder may be added to the thin mixture coatings, thereby making even such thin coatings highly thermally conductive.

It may be appreciated that the thermally conductive film of the present invention need not be adhered to the IC package and PCB at the same time. For example, the film may be attached to the PCB only (at, for example, an empty IC slot on the PCB) by applying a thin coating of resin portion/curing agent portion mix (or such mix with alumina added) to one side of the thermally conductive film, pressing the film onto the PCB at the empty IC slot with the "wetted" surface of the film against the surface of the PCB, and applying pressure between the film and PCB until the coating cures in the manner discussed above. At a later time an IC package may be inserted into the slot and bonded to the PCB by applying a thin layer of resin portion/curing agent portion mix (or such mix with alumina added) to the exposed side of the thermally conductive film, pressing the IC package onto the PCB over the film, and maintaining a small amount of pressure between the IC and the PCB until such newly applied coating cures. Alternately, the thermally conductive film may be first attached in the manner described above to the underside of an unused IC package and, when such IC package is to be mounted on the PCB, the film may be lightly coated in the manner described above and the IC inserted into a slot on the PCB and pressed against the surface of the PCB until such coating cures, providing a low-strength bond between the IC package and PCB and providing a thermally conductive path therebetween.

Figure 2:
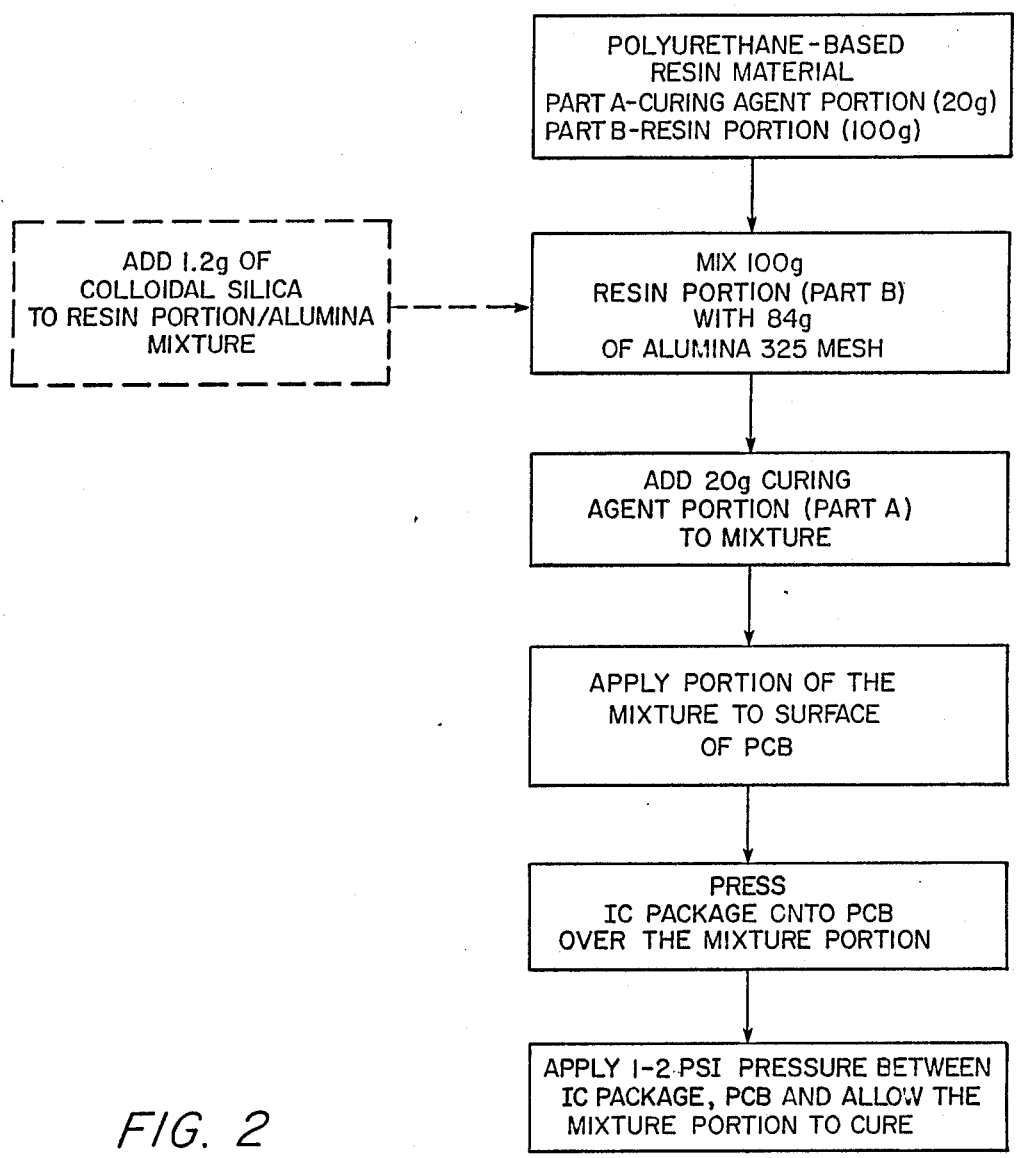
FIG. 2 is a flow diagram of a second embodiment of the process of the present invention of formulating the thermally conductive adhesive of the present invention and bonding an IC package to a PCB with such thermally conductive adhesive.

Referring now to FIG. 2, an alternate embodiment of the present invention is illustrated, in which the polyurethane-based resin-alumina mixture is applied directly between an IC package and a mounting substrate and cured, rather than being cured in the shape of a film or sheet as described above. That is, upon adding the curing agent portion to the mixture of the resin portion and alumina, a portion of the material, before curing (i.e. within 20 to 30 minutes after adding the curing agent), is applied directly as a paste to a mounting substrate (such as a PCB), such as by spreading the paste-like mixture onto the surface of the PCB with a blade or other suitable applicator. Then, a device (such as an IC package) is pressed onto the PCB over the material paste. Pressure (approximately 1 to 2 psi) is maintained between the IC and PCB until the material cures. Here, curing takes approximately 16 hours at room temperature followed by 10 hours at 80° C, as discussed. Since the IC package and PCB are not made from non-stick material (such as Teflon ® material), the mixture when cured will adhere to the IC and PCB, thereby providing a low-strength bond and a thermally conducting path between the IC package and the PCB.

Figure 3:
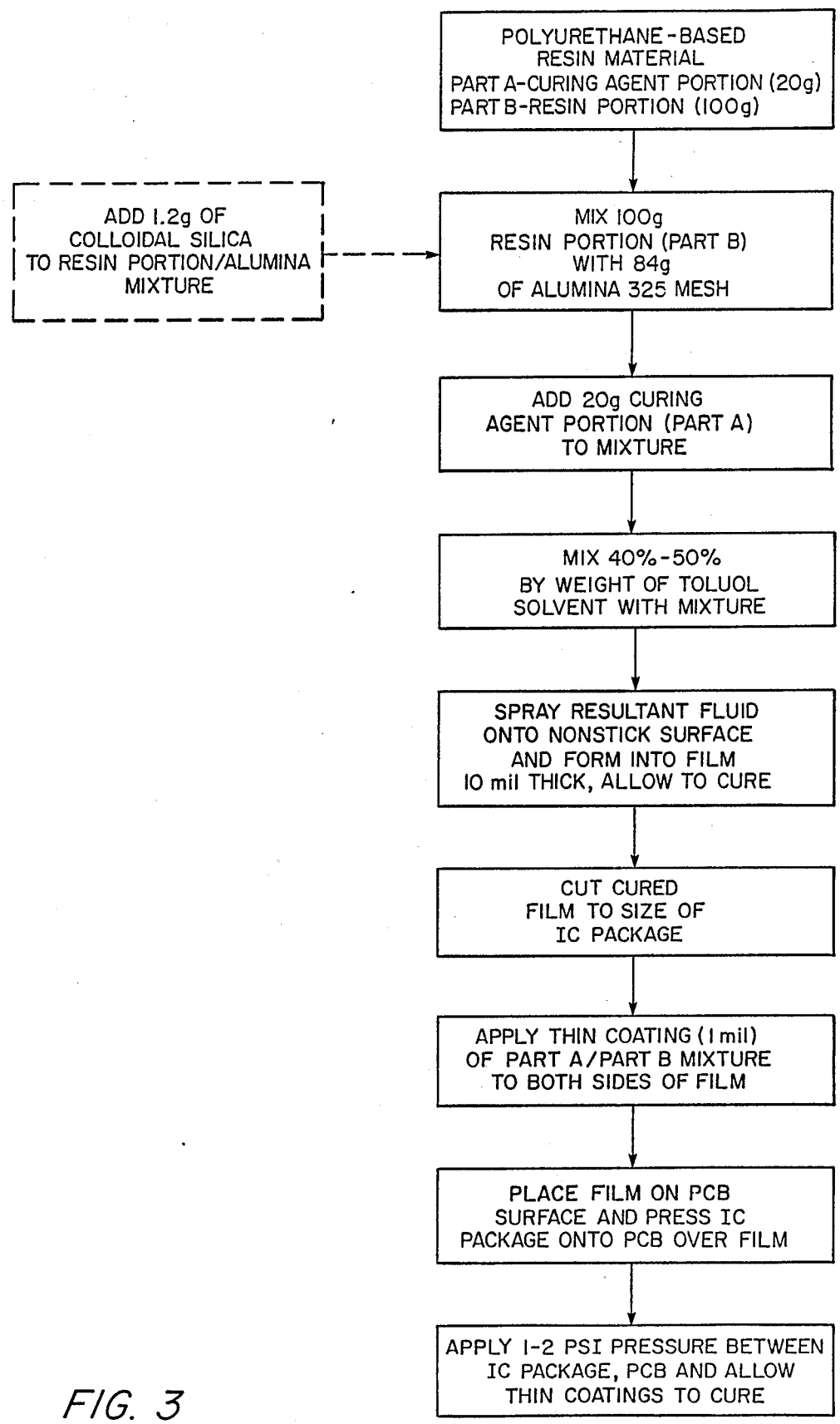
FIG. 3 is a flow diagram of a third embodiment of the process of the present invention of formulating the thermally conductive adhesive of the present invention and bonding an IC package to a PCB with such thermally conductive adhesive.

Referring now to FIG. 3, a third embodiment of the present invention, in which the thermally conductive adhesive of the present invention is applied as a spray to a mounting surface, is illustrated. The process is the same as discussed above up to the step of adding the 20g of curing agent portion to the resin portion/alumina mixture. Before the mixture begins to harden (that is, within 20 to 30 minutes after adding the curing agent portion) a suitable (solvent) is added to the mixture in an amount ranging from 40% to 50% of the total weight of the mixture. Thus, to the mixture of the preferred embodiment having a total weight of 204g (100g resin portion, 84g alumina, 20g curing agent portion), between 81.6g and 102g of a suitable solvent are added. Here, the solvent comprises the commercially-available chemical toluol (also known as toluene), but other suitable solvents may be substituted therefor. After the adhesive mixture and solvent have been thoroughly blended, the resultant fluid may be used for 2 to 4 hours before hardening due to the action of the curing agent. The fluid thus may be sprayed onto a non-stick surface, such as a Teflon ® material-coated surface to a predetermined thickness (such as 10 mils), and a film of such thickness formed therefrom by allowing the sprayed adhesive to cure. As discussed, here curing takes 16 hours at room temperature followed by 10 hours at 80°C. The adhesive film formed thereby may then be cut to the size of a device to be mounted to the mounting surface. The subsequent mounting procedure is identical to that described in the process of FIG. 1.

After the IC package is mounted and bonded to the PCB by the thermally conductive adhesive of the present invention (by the processes of FIG. 1, FIG. 2 or FIG. 3), the PCB may be cleaned with any conventional solvent such as Freon TF TM solvent manufactured by DuPont Company of Wilmington, Delaware. Such solvent cleaning will not deteriorate the thermally conductive adhesive of the present invention. Nor will such adhesive swell or emit material which would degrade the adherence of a conformal coating (such as PC 29M material, manufactured by the Hysol Division of Dexter Corporation of Olean, New York) applied over the IC's and PCB. As is known, a conformal coating is typically applied to the surface of a PCB and to all devices (such as IC packages) mounted thereon to protect the PCB and devices from handling and moisture.

It has been found that the thermally conductive adhesive of the present invention also has very low outgassing properties. That is, the adhesive has a minimal tendency to evaporate small portions of the material in the form of gas molecules, making the polyurethane-based thermally conductive adhesive of the present invention useful in applications where PCBs operate in low atmospheric pressure and vacuum environments. For example, tests have shown that the mixture of 120g Uralane 5753 TM (100g of part B, 20g of part A) and 84g alumina undergoes a total weight loss of approximately 0.05% in a vacuum at 100°C. The total weight loss of the same material mixed with 40% and 50% by weight of toluol solvent (see FIG. 3) rises only to 0.13% and 0.33%, respectively. In no case has it been found that any of the minute amounts of outgassed material were deposited on cold surfaces (such as optics, etc.).

As discussed, the thermally conductive adhesive of the present invention provides a low modulus, thermally conducting layer between a PCB and an IC package mounted thereon, while providing a relatively weak bond therebetween. For example, it has been found that the adhesion of the material of the preferred embodiment (120g Uralane 5753 TM, parts A/B, 84g alumina) is less than 300 psi at room temperature. This is to be compared with an adhesion of 1800-2000 psi for a thermally conductive epoxy, such as the Ablestik TM epoxy discussed above. (Thus, an IC package bonded to a PCB with the thermally conductive adhesive of the present invention may be removed from the PCB without damaging the IC or the board.) When the IC is replaced or re-mounted on the board, the device is re-bonded to the thermally conductive adhesive by applying a thin coating of an uncured mixture of the resin portion (either mixed with alumina or unmixed) and curing agent portion to the thermally conducting layer on the PCB and pressing the IC package onto the PCB over the coated adhesive layer. Pressure is maintained between the IC and PCB until the coating cures as described above.

Figure 4:
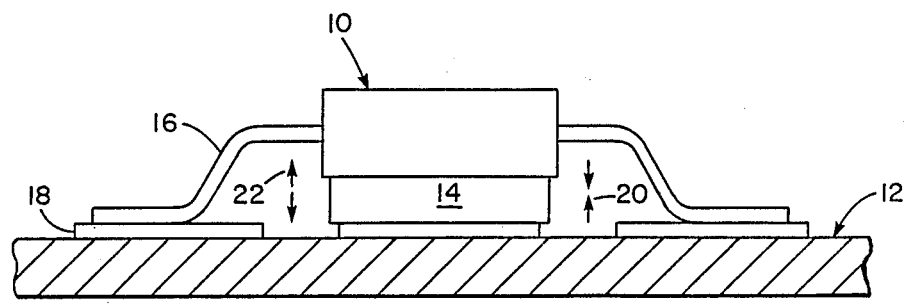
FIG. 4 is an end-on view of an IC packaqe bonded to a PCB by the thermally conductive adhesive of FIGS. 1, 2 or 3.

Referring now to FIG. 4, shown is an end-on view of an IC package 10 mounted on a PCB 12 with the thermally conductive adhesive material 14 of the present invention disposed therebetween. Adhesive material 14 has been applied by any of the methods of FIGS. 1, 2 or 3, that is, as a film (FIGS. 1, 3) or as a paste (FIG. 2). As discussed, the compression and tension modulus characteristics of thermally conducting adhesive 14 (that is, the ratio of applied stress to resultant strain of the adhesive) are quite low, approximately 1,760 psi and 3,260 psi, respectively, at room temperature. This is to be compared to typical epoxies (such as Ablestik TM epoxy), which have moduli greater than 500,000 psi at room temperature. Because of the low modulus of thermally conductive adhesive 14, such material is soft and pliable and may be easily deformed. In typical applications, printed circuit board 12 and the IC package 10 mounted thereon are made of different materials (for example, an epoxy or polymide PCB and a ceramic IC package) having different rates of thermal expansion. The low modulus characteristics of polyurethane-based thermally conductive adhesive 14 of the present invention allows such adhesive interposed between the IC and PCB to deform in response to the different thermally-induced expansions or contractions of the PCB and IC package. For example, when IC package 10 and PCB 12 are exposed to elevated temperatures, each structure tends to expand, applying compression stress in the direction of arrows 20 against thermally adhesive material 14. Conversely, tension stress in the direction of arrows 22 is applied to thermally conductive adhesive material 14 when IC package 10 and PCB 20 contract as such structures are cooled. In both cases, the conductive adhesive material 14 of the present invention deforms to the stress applied thereto, due to the low modulus of adhesive material 14, thereby avoiding the damage to PCB 12, or IC package 10, or separation of solder connections between IC leads 16 and PCB "runs" 18 which would occur if adhesive material 14 had a high modulus and was rigid. That is, the adhesive 14 of the present invention will readily compress as IC package 10 and PCB 12 expand against each other when heated, and such material conversely will easily stretch as the IC package and PCB separate slightly (i.e., as each contract) when cooled.

It is desirable for the thermally conductive adhesive to maintain such low modulus characteristic throughout the operating temperature range of the PCB and IC packages mounted thereon. Below a predetermined temperature, known as the glass transition temperature $T_g$, the modulus of polyurethane-based resin materials increases sharply and dramatically. That is, below $T_g$, polyurethane-based resin materials become rigid and hard. Typical polyurethane-based resin materials, such as Scotchcast 226 TM resin, manufactured by 3M Company of St. Paul, Minnesota, have glass transistion temperatures of between 0°C. and −20°C. Thus, if the PCB and IC's mounted thereon will be used above such temperatures, polyurethane-based resins such as Scotchcast 226 TM resin may, be substituted for the Uralane 5753 TM resin discussed above. However, if the IC packages mounted on the PCB must operate at lower temperatures, such as −50°C., the Uralane 5753 TM resin discussed above should be used, as it has been found that the glass transition temperature of Uralane 5753 TM resin is as low as −60°C. Therefore, it is seen that the thermally conductive adhesive of the present invention will, if formulated from a polyurethane-based resin such as Uralane 5753 TM, remain soft, pliable and deformable (i.e. maintain a low modulus) at temperatures below −50°C. As an example, it has been found that the compression modulus of elasticity of Scotchcast 226 TM resin is approximately 300,000 psi at −30°C, while the compression modulus of elasticity of the adhesive of the preferred embodiment is found to be only about 4,160 psi at −30°C. (as compared to a compression modulus of 1,760 psi at room temperature).

Having described preferred embodiments of the present invention, other embodiments may become apparent to those skilled in the art. For example, it has been found that the thermally conductive adhesive of the present invention may be used with a low modulus, low materials other than IC packages and PCB's. For example, the adhesive material of the present invention may be used to bond a PCB to a metal substrate, such as aluminum or nickel. Accordingly, it is understood that the scope of the present invention is to be limited only by the scope of the appended claims.

What is claimed is:

1. A process of bonding an integrated circuit package to a mounting surface, such process comprising the steps of:
   (a) providing a polyurethane-based resin material;
   (b) mixing a thermally conductive material with such polyurethane-based resin material;
   (c) curing said mixture while forming a film having a predetermined thickness from said mixture;
   (d) cutting such film into a section, the section having the approximate size of the integrated circuit package;
   (e) applying a predetermined amount of said polyurethane-based resin material to first and second surfaces of the film section;
   (f) placing the film section on the mounting surface, with the first surface of the film section contacting the mounting surface;
   (g) placing the integrated circuit package on the second surface of the film section; and
   (h) curing such polyurethane-based resin material while applying a predetermined amount of pressure to the integrated circuit package against the mounting surface.

2. A process of bonding an integrated circuit package to a mounting surface, such process comprising the steps of:
   (a) providing a polyurethane-based resin material;
   (b) mixing a thermally conductive, electrically insulating material with the resin material;
   (c) adding a curing agent to the mixture;
   (d) applying a portion of the mixture to the mounting surface;
   (e) placing the integrated circuit package on the mounting surface and over the mixture portion; and
   (f) applying pressure between the integrated circuit package and the mounting surface while allowing said mixture portion to cure.

3. The process of claim 2 wherein the polyurethane-based resin material has a modulus of elasticity on the order of 2,000 psi at room temperature.

4. The process of claim 3 wherein the polyurethane-based resin material maintains such modulus of elasticity on the order of 2,000 psi at temperatures below −50°C.

5. The process of claim 2 wherein the mixing step comprises the step of mixing the thermally conductive, electrically insulating material to a concentration of approximatly 70% by weight of the polyurethane-based resin material.

6. The process of claim 2 wherein the thermally conductive, electrically insulating material comprises alumina.

7. The process of claim 2 comprising the additional step of adding a predetermined amount of a colloidal silica to the mixture prior to the step of applying the curing agent to the mixture.

8. A process of bonding an electrical device package to a mounting surface, such process comprising the steps of:
   (a) providing a polyurethane-based resin material;
   (b) mixing a thermally conductive, electrically insulating material with the resin material;
   (c) adding a curing agent to the mixture;
   (d) subsequently adding a solvent to the mixture to form a liquid;

(e) spraying the liquid onto a surface to a predetermined thickness and allowing such liquid to cure as a film;

(f) cutting the cured film into a section having the approximate size of the electrical device package;

(g) applying a predetermined amount of said polyurethane-based resin material to first and second surfaces of the section of film;

(h) subsequently placing the section of film on the mounting surface, with the first surface of the section of film contacting the mounting surface;

(i) placing the electrical device package on the second surface of the section of film; and (j) curing the applied polyurethane-based resin material while applying a predetermined amount of pressure to the electrical device package against the section of film and mounting surface.

9. The process of claim 8 wherein the polyurethane-based resin material has a modulus of elasticity on the order of 2,000 psi at room temperature.

10. The process of claim 9 wherein the polyurethane-based resin material maintains such modulus of elasticity on the order of 2,000 psi at temperatures below −50°C.

11. The process of claim 8 wherein the mixing step comprises the step of mixing the thermally conductive, electrically insulating material to a concentration of approximately 70% by weight of the polyurethane-based resin material.

12. The process of claim 8 wherein the thermally conductive, electrically insulating material comprises alumina.

* * * * *